US009587318B2

(12) United States Patent
Xie et al.

(10) Patent No.: US 9,587,318 B2
(45) Date of Patent: Mar. 7, 2017

(54) METHOD FOR CONTINUOUSLY PRODUCING FLEXIBLE COPPER CLAD LAMINATES

(75) Inventors: Xinlin Xie, Shenzhen (CN); Nianqun Yang, Shenzhen (CN)

(73) Assignee: RICHVIEW ELECTRONICS CO., LTD., Wuhan (CN)

( * ) Notice: Subject to any disclaimer, the term of this patent is extended or adjusted under 35 U.S.C. 154(b) by 191 days.

(21) Appl. No.: 13/823,569

(22) PCT Filed: May 10, 2011

(86) PCT No.: PCT/CN2011/000811
§ 371 (c)(1),
(2), (4) Date: Apr. 16, 2013

(87) PCT Pub. No.: WO2012/040993
PCT Pub. Date: Apr. 5, 2012

(65) Prior Publication Data
US 2013/0228468 A1    Sep. 5, 2013

(30) Foreign Application Priority Data

Sep. 30, 2010   (CN) .......................... 2010 1 0510358

(51) Int. Cl.
*C25D 5/54*    (2006.01)
*C25D 5/34*    (2006.01)
(Continued)

(52) U.S. Cl.
CPC ............ *C23C 28/023* (2013.01); *C23C 14/20* (2013.01); *C23C 14/221* (2013.01); *C23C 14/48* (2013.01);
(Continued)

(58) Field of Classification Search
CPC ................................. C25D 1/04; C23C 28/02
(Continued)

(56) References Cited

U.S. PATENT DOCUMENTS 4,193,849 A * 3/1980 Sato ...................... H05K 3/146
 205/125
4,231,848 A * 11/1980 Kawasumi ............... C25D 5/10
 205/102
(Continued)

FOREIGN PATENT DOCUMENTS

CN    1669787    9/2005
CN    1952209    4/2007
(Continued)

OTHER PUBLICATIONS

K.S. Fancey, A. Matthews, "Coating thickness fall-off with source to substrate distance in PVD processes" Surface and Coatings Technology, vol. 59, Issues 1-3, Oct. 1, 1993, pp. 113-116.*
(Continued)

*Primary Examiner* — Edna Wong
(74) *Attorney, Agent, or Firm* — Fay Kaplun & Marcin, LLP

(57) ABSTRACT

Method for continuously producing flexible copper clad laminates includes performing continuous ion implantation and/or plasma deposition on the surface of an organic macromolecular polymer film, and performing continuous copper plating. The bonding force between the copper film and the substrate in a two-layer flexible copper clad laminate produced by the method is much larger than that in a flexible copper clad laminate produced by a sputtering/plating method and equivalent to that in a flexible copper clad laminate produced by a coating method and a lamination method. Meanwhile the thickness of the copper film can be easily controlled to be less than 18 microns.

20 Claims, 4 Drawing Sheets

(51) Int. Cl.
| | |
|---|---|
| *C23C 28/02* | (2006.01) |
| *C23C 14/20* | (2006.01) |
| *C23C 14/48* | (2006.01) |
| *C23C 14/56* | (2006.01) |
| *C25D 1/04* | (2006.01) |
| *C25D 3/38* | (2006.01) |
| *C23C 14/22* | (2006.01) |
| *C23C 28/00* | (2006.01) |

(52) U.S. Cl.
CPC ............ *C23C 14/562* (2013.01); *C23C 28/00* (2013.01); *C23C 28/42* (2013.01); *C25D 1/04* (2013.01); *C25D 3/38* (2013.01); *C25D 5/34* (2013.01)

(58) Field of Classification Search
USPC .................... 427/569, 248; 205/165, 205
See application file for complete search history.

(56) References Cited

U.S. PATENT DOCUMENTS

| | | | | |
|---|---|---|---|---|
| 4,313,815 | A * | 2/1982 | Graves, Jr. ............... | B01J 3/006 204/192.12 |
| 4,447,773 | A * | 5/1984 | Aston .................... | H01J 27/022 313/360.1 |
| 4,601,260 | A * | 7/1986 | Ovshinsky ............ | C23C 16/545 118/50.1 |
| 4,645,977 | A * | 2/1987 | Kurokawa et al. ...... | 315/111.21 |
| 4,683,149 | A * | 7/1987 | Suzuki .................... | C23C 14/22 427/255.7 |
| 4,805,690 | A * | 2/1989 | Minami ................ | B29C 33/044 165/104.25 |
| 5,360,483 | A * | 11/1994 | Kurokawa et al. ...... | 118/723 E |
| 5,425,862 | A * | 6/1995 | Hartmann et al. ............ | 204/207 |
| 6,036,758 | A * | 3/2000 | Fairweather .............. | C23F 1/18 106/14.13 |
| 6,083,567 | A * | 7/2000 | Vesnovsky ............ | C23C 14/022 148/239 |
| 6,224,722 | B1 * | 5/2001 | Ameen et al. ........... | 204/290.12 |
| 6,881,319 | B2 * | 4/2005 | Seita ........................ | C25D 3/38 106/1.26 |
| 7,241,490 | B2 | 7/2007 | Aida | |
| 7,767,126 | B2 * | 8/2010 | Kang et al. .................... | 264/220 |
| 2003/0094376 | A1 * | 5/2003 | Seita et al. .................... | 205/291 |
| 2005/0214551 | A1 * | 9/2005 | Aida ...................... | C23C 14/022 428/458 |
| 2006/0024428 | A1 | 2/2006 | Cho | |
| 2006/0118424 | A1 * | 6/2006 | Nomura ................ | C25D 7/0614 205/118 |
| 2007/0042129 | A1 * | 2/2007 | Kang .................. | C23C 18/1605 427/510 |
| 2008/0182112 | A1 * | 7/2008 | Kaneshiro et al. ........... | 428/458 |
| 2009/0169766 | A1 * | 7/2009 | Takahashi ............... | C23C 14/32 427/523 |
| 2009/0238951 | A1 * | 9/2009 | Lee ........................ | H01G 4/005 427/11 |

FOREIGN PATENT DOCUMENTS

| | | | |
|---|---|---|---|
| CN | 102021576 | | 4/2011 |
| EP | 1 514 957 | | 3/2005 |
| JP | 61-159569 | | 7/1986 |
| JP | 11335837 | A * | 12/1999 ............. C23C 14/56 |
| KR | 20080087622 | * | 10/2008 |
| WO | WO2009024460 | * | 2/2009 |
| WO | WO2010024187 | A1 * | 3/2010 |

OTHER PUBLICATIONS

Gregg et al., "Roll-to-Roll Manufacturing of Flexible Displays", © no month, 1995, p. 417.*

* cited by examiner

METHOD FOR CONTINUOUSLY PRODUCING FLEXIBLE COPPER CLAD LAMINATES

TECHNICAL FIELD

The present invention relates to a process for the production of flexible copper-clad laminate, especially a process for the continuous production of two-layer-type flexible copper-clad laminate.

BACKGROUND ART

FCCL (Flexible Copper Clad Laminate) is a copper-clad laminate having a better flexural property formed by bonding a single side or double sides of a flexible insulating material such as polyester films (PET) or polyimide films (PI) to copper foil having a certain thickness by a certain technological treatment. FCCL comprises 3L-FCCL containing adhesives and 2L-FCCL containing no adhesives. As compared with 3L-FCCL, 2L-FCCL has better performances in, such as thermal resistance, size, stability, ageing resistance, reliability and the like because of containing no epoxy adhesives or acrylate adhesives, so as to achieve rapid development.

At presence, there are mainly three processes for preparing 2L-FCCL, i.e. (1) Coating (Casting), (2) Lamination, and (3) Sputtering/Plating, having their own peculiarities.

1. Casting:

The early casting process comprising single-side coating a prepolymer (polyamic acid, PAA) of PI onto the surface of copper foil, drying to remove the solvent and high temperature imidizing. Such process has relatively simple procedures and is easy to carry out, but the product has a worse bonding property between the copper layer and PI and a worse size stability.

In recent years, a multilayer coating process is developed in the industry, comprising coating (casting) on the surface of the copper foil a layer of thermoplastic PI (TPI) resin, and then a layer of PI (low CTE-PI) resin having a low thermal expansion coefficient, finally a layer of thermoplastic PI(TPI) resin, high temperature imidizing and laminating with the copper foil to form a product.

The multilayer coating (casting) process may achieve the effects at two aspects, i.e. (1) having good consistency between the bonding property and size stability of the product; and (2) maintaining the symmetry of the whole structure and reducing the curling of the product.

There are a few flaws with the multilayer coating (casting) process, such as complex procedures, higher device investment coast, and the like. Due to the technical problems during the preparation of thin copper foil, such process is difficult to be used for producing 2L-FCCL having a copper foil thickness of 18 μm or less. Such process is mainly used for producing single sided laminates.

2. Lamination is one technological process which has been rapidly development in recent years, comprising double-side or single-side coating a prepolymer (polyamic acid, PAA) of a thermoplastic PI resin having excellent bonding properties on the basis of PI (CTE-PI) film having a low expansion coefficient, drying and imidizing to form a composite film, re-melting the thermoplastic resin at high temperature and high pressure, laminating with copper foils to form a single-sided or double-sided product.

Currently, the basement membrane providers provide such composite films consisting of PI films having a high size stability and a layer of thermoplastic PI resin (TPI) coated on the PI films. FCCL manufacturers can directly hot-press the composite films and copper foils into laminates.

Lamination is characterized in (1) relatively simple production procedures, a higher cost than the coating process; (2) being adapted to the product model of small batch and various variety; (3) being useful for production of single sided and double sided products; and (4) the product having the comprehensive performances of excellent bonding properties and size stability.

Due to the technical problems during the preparation of thin copper foil, such process is also difficult to be used for producing 2L-FCCL having a copper foil thickness of 18 μm or less.

3. Sputtering/Plating

In vacuum environment, the ionized argon ion ($Ar^+$) is used to bombard the target (copper) surface, so that atoms (copper atoms) on the target are "sputtered" (there will be spray sputtering if stones are thrown into water). The sputtered copper atoms are adsorbed and deposited onto the surface of the substrate PI films to form a thin copper layer, and then the copper layer is thickened by electroplating to the required thickness.

By such process, various single sided or double sided 2L-FCCLs having a thickness of 5-12 μm will be readily produced, but the peeling strength of copper foils is greatly lower than 2L-FCCLs produced by the coating process and lamination process.

Among said three processes, 2L-FCCLs produced by the coating and lamination processes have a better bonding force between copper foils and PI matrix, i.e. a high peeling strength, but have a higher cost due to complex production processes and high requirements on the devices. Furthermore, since the formed copper foils (rolled copper foil and electrodeposited copper foil) shall be used, rolled copper foil and electrodeposited copper foil are difficult to have a thickness less than 19 μm, such as 12 μm, 9 μm, 7 μm and the like due to the technological limitations. Thus the application thereof in high-grade precision electronic products based on HDI (high density internet base plate) and COF (Chip on Flex), such as liquid crystal (plasma) displays, liquid crystal (plasma) televisions and the like, is limited.

On the contrary, the sputtering/plating can be used to readily produce 2L-FCCLs of various ultrathin copper foils (such as 12 μm, 9 μm, or even 7 μm and 5 μm) with a lower cost. However, because of limitation of the sputtering technologies, the bonding force between the metal copper foils and PI films (peeling strength) is far lower than the bonding force between the metal layer and films in 2L-FCCLs produced by the coating and lamination processes, so as to affect the generalization and application thereof. For example, FCCLs produced by the lamination and coating processes have a peeling strength of greater than or equal to 0.6 N/mm, while those produced by the sputtering/plating (spraying plating method) have a peeling strength of about 0.35 N/mm. Thus there really needs a novel process for producing 2L-FCCLs in the art so as to meet the requirements on the development of the industry of flexible printed circuit board (FPC).

CONTENTS OF THE INVENTION

In order to overcome the technical defects in the prior art, the present invention provides 2L-FCCL capable of continuous production of ultrathin copper foils, wherein the bonding force (peeling strength) between copper foils of such FCCL and the PI films is higher and achieves the level equivalent to the coating process and lamination process.

The prevent invention provides a process for the continuous production of flexible copper-clad laminate, characterized in comprising a step of continuously electrocoppering after steps of conducting the continuous ion implantation to the surface of an organic macromolecular polymer film and/or the plasma deposition, wherein said continuous ion implantation and/or plasma deposition are/is carried out in an equipment comprising an ion source and a vacuum chamber; the vacuum chamber comprises on the walls a vacuum orifice and at least one opening connecting with said ion source; the vacuum chamber comprises a unreeling robber, a tension adjusting unit, a cooling part, and a wind up roller; said cooling part is placed between said unreeling robber and wind up roller; said tension adjusting unit is displaced at both sides of the cooling part and between said unreeling robber and wind up roller; said cooling part consists of at least one hollow cooling roller free to rotate and in which the cooling medium passes; said cooling roller, unreeling robber and wind up roller are parallel to each other, and the cooling roller is axially perpendicular to the direction along which said plasma is fed into the vacuum chamber; the direction of said plasma along which said plasma is fed into the vacuum chamber and the axial direction of said cooling roller both are horizontal; said cooling roller horizontally corresponds to said openings; or said plasma is fed into the vacuum chamber in the horizontal direction; said roller is axially in the upright direction; said openings and said cooling roller correspond to each other in the left and right directions or in the front and rear directions; or said plasma is fed into the vacuum chamber in the vertical direction, and said cooling roller is correspondingly placed right below or right above said openings.

The bonding force (peeling strength) between the copper films and the substrate in 2L-FCCLs produced by the processes of the present invention is far greater than the bonding force between the copper films and the substrate in FCCLs produced by the sputtering/plating processes, and is equivalent to the bonding force between the copper films and the substrate in FCCLs produced by the coating and lamination processes. Moreover, the thickness of the copper films may be readily controlled to be less than 18 µm, i.e. 12 µm, 9 µm, or even 7 µm and 5 µm. Upon detection, FCCLs produced by the process of the present invention has a peeling strength of higher than 0.6 N/mm, the highest reaching 0.83 N/mm. More important, the process of the present invention is the process for the continuous production of 2L-FCCLs, and can operate not only one side of the film substrate, but also two sides of the film substrate at the same time. That is to say, the present process can be used for producing not only 2L-single-sided FCCLs, but also 2L-double-sided FCCLs, so as to have a very high yield.

EMBODIMENTS

Figure 1:
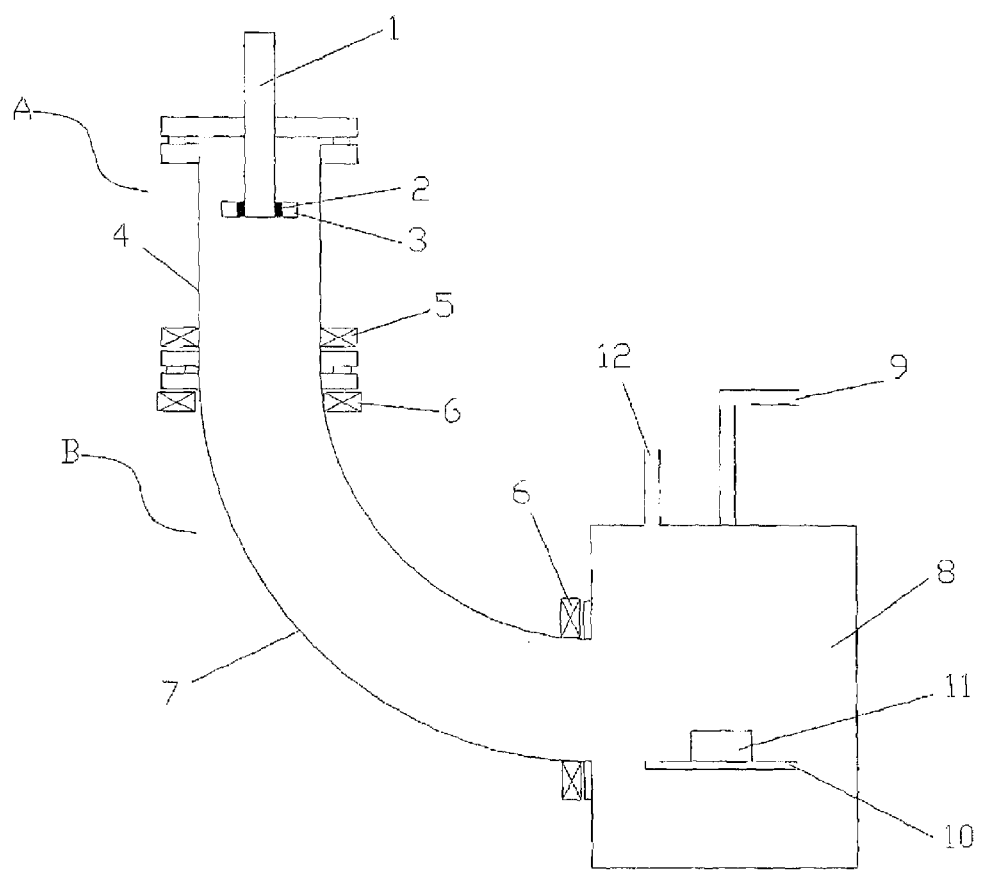
FIG. 1 shows the schematic diagram of magnetic filter vacuum arc ion source.

The prevent invention provides a process for the continuous production of flexible copper-clad laminate, characterized in comprising a step of continuously electrocoppering after steps of conducting the continuous ion implantation to the surface of an organic macromolecular polymer film and/or the plasma deposition, wherein said continuous ion implantation and/or plasma deposition are/is carried out in an equipment comprising an ion source and a vacuum chamber; the vacuum chamber comprises on the walls a vacuum orifice and at least one opening connecting with said ion source; the vacuum chamber comprises a unreeling robber, a tension adjusting unit, a cooling part, and a wind up roller; said cooling part is placed between said unreeling robber and wind up roller; said tension adjusting unit is displaced at both sides of the cooling part and between said unreeling robber and wind up roller; said cooling part consists of at least one hollow cooling roller free to rotate and in which the cooling medium passes; said cooling roller, unreeling robber and wind up roller are parallel to each other, and the cooling roller is axially perpendicular to the direction along which said plasma is fed into the vacuum chamber; the direction of said plasma along which said plasma is fed into the vacuum chamber and the axial direction of said cooling roller both are horizontal; said cooling roller horizontally corresponds to said openings; or said plasma is fed into the vacuum chamber in the horizontal direction; said roller is axially in the upright direction; said openings and said cooling roller correspond to each other in the left and right directions or in the front and rear directions; or said plasma is fed into the vacuum chamber in the vertical direction, and said cooling roller is correspondingly placed right below or right above said openings.

Since the cooling components are used, the damage of films by a substantial amount of heat produced by plasma deposition and/or ion implantation for a long period of time can be prevented. The materials composing said cooling rollers may be those having a better thermal conductivity, e.g. metals, preferably stainless steel. The shapes of the cooling rollers are not particularly defined, preferably cylindrical shape. Gases or liquids, even solids (e.g. dry ice) may be fed into the hollow part of the cooling roller to cool the films, wherein the cooling medium is preferably liquids having a better thermal conductivity, e.g. cooling oil or water. In consideration of cost, the cooling medium is preferably water which is at room temperature, preferably at a temperature of 0-10° C. so as to provide excellent cooling effect.

The materials of the unreeling rollers and the wind up rollers are not particularly defined, and they may be made of woods, plastics and metals, preferably metals, most preferably stainless steel. Their shapes are not particularly defined, and they may be in a square or cylindrical shape, preferably in a cylindrical shape. When said unreeling rollers and wind up rollers are in a cylindrical shape, a cylindrical shape may be topically formed, or a cylindrical jacket may be covered so as to be convenient for rotation. The size of said unreeling rollers and wind up rollers may be adjusted according to the material properties and the load as required.

A tension adjusting unit is set up in the vacuum chamber to ensure a full expansion of the films, so as to be advantageous to forming a homogeneous metal layer on the films.

When the plasma deposition and/or ion implantation are/is conducted for the films, the films are disposed on the unreeling rollers, and one end of the films passes through the tension adjusting unit, cooling component, tension adjusting unit in turn and finally is fixed onto said wind up rollers. The unreeling rollers and wind up rollers are rotated to adjust the running speed of the films. Ion sources are turned on to make the plasma pass through the openings of the walls of the vacuum chamber, so as to conduct the continuous plasma deposition and/or ion implantation. The rotation of said unreeling rollers and wind up rollers can be conducted manually or by mechanical control. For example, one end of said unreeling rollers and wind up rollers is expanded outside the vacuum chamber, and said unreeling rollers and wind up rollers are rotated manually; or said unreeling rollers and wind up rollers are connected with the electric machine to adjust the running speed of the films by turning on the electric machine.

Preferably, said equipment further comprises the electric machines connected with said unreeling roller and wind up roller, and the part for accelerating the plasma beam stream emitted from the ion source. Said part is disposed between said plasma source and said vacuum chamber, and comprises a power supply and a controlling unit which may be any suitable controlling unit in the art, e.g. an adjusting unit to adjusting the accelerating voltage.

The vacuum chamber of the equipment is preferably equipped with the brackets, and said electric machines, said unreeling roller, said tension adjusting unit, said wind up roller and said cooling part all are disposed on said brackets.

The ion sources used by said equipment are not specially limited, and can be any ion source in the art, preferably metal vapor vacuum arc ion source or magnetic filter vacuum arc ion source.

Preferably, said equipment further comprises the electric machines which are connected with the unreeling roller and wind up roller. The electric machines may be disposed inside or outside the vacuum chamber, preferably outside the vacuum chamber. There may be one or more electric machines, preferably more electric machines. When there are more electric machines, and while conducting the plasma deposition and/or ion implantation to the films, the rotating speeds of these electric machines are adjusted to match the numbers of revolution of the unreeling roller and wind up roller and to operate the tension adjusting unit to prevent the films from forming frillings or accumulation between the unreeling roller and wind up roller.

In another preferred embodiment, based on the functions implemented by the equipment provided by the present invention, there are more openings, preferably 2-10 openings, so as to be convenient for the continuous ion implantation and/or plasma deposition of the equipment. When there are more openings, a valve is preferably disposed between the openings and said ion source, so as to close or open the channel between said openings and said ion source, so as to rapidly change the cathode while maintaining the vacuum degree of the vacuum chamber. Said openings may be disposed on the same side of said vacuum chamber, or at different sides of said vacuum chamber, preferably at two opposite sides. The openings disposed at different sides may be equally distributed and homogeneously arranged, or unequally distributed and unevenly arranged. When the ion implantation and plasma deposition need to be conducted simultaneously in the equipment provided by the present invention, a part of said openings are used to pass the plasma beam for ion implantation, and the other part of said openings are used to the plasma beam for plasma deposition.

When the openings are disposed at two opposite sides of the equipment provided by the present invention, the plasma deposition and/ion deposition of two sides of the films can be readily achieved. If the openings are disposed at two opposite sides of the equipment provided by the present invention, and the single-sided plasma deposition and/or ion implantation of the films need to be conducted, only the valve needs to be adjusted to close the openings at one side of the vacuum chamber, or the ion source at one side turns on so as to achieve the single-sided plasma deposition and/or ion implantation.

The cooling part of the equipment consists of many cooling rollers to as to better effect the cooling effect. In one preferred embodiment, there are 2-10 cooling rollers. In another preferred embodiment, the amount of the cooling rollers is the same as the amount of the openings, i.e. 2-10.

In another preferred embodiment, there are 6 openings, wherein three openings are respectively disposed at two opposite walls of the vacuum chamber, in order to conduct the ion implantation for the films, and then the plasma deposition. One opening on each wall may be used for ion implantation, and the other two adjacent openings on each wall may be used for plasma deposition. Moreover, two openings for ion implantation are disposed adjacent to one end of said unreeling roller; four openings for plasma deposition are disposed adjacent to one of said wind up roller.

In order to make the scope distribution of ion implantation and the thickness of plasma deposition more homogeneous, the ratio of said openings between the running direction of films and the diameter of said cooling rollers is preferably controlled within a certain scope. When said openings are in a rectangular shape, two sides of such rectangle are axially parallel to said cooling roller; the other two sides are axially perpendicular to said cooling roller. Through a large number of researches, it is found that, when the size of two sides axially perpendicular to the cooling roller is 0.3-1 times the diameter of the cooling roller, the scope of ion implantation onto the films or the thickness of plasma deposition onto the films is more homogeneous, so as to achieve a more homogeneous adhesive force between the CCLs deposited on the films and the films. In another preferred embodiment, said opening is rectangular. Two sides of such rectangle is axially parallel to the cooling roller; the other two sides are axially perpendicular to the cooling roller, wherein the size of two sides axially perpendicular to the cooling roller is 0.3-1, preferably 0.5-0.8 times the diameter of the cooling roller.

The inventor of the present invention finds that, in order to achieve better ion implantation and plasma deposition, the ratio of the distance between said openings and the axial line of the corresponding cooling roller to the diameter of said cooling roller is preferably controlled within a certain scope. Through a large number of studies, it is found that, when the distance between said openings and the axial line of the corresponding cooling roller is 0.5-3, particularly 1-2.5 times the diameter of said cooling roller, there is a higher efficiency of ion implantation and plasma deposition. In one preferred embodiment, the distance between said openings and the axial line of the corresponding cooling roller is 0.5-3, most preferably 1-2.5 times the diameter of said cooling roller.

The inventor of the present invention finds that, in order to prevent mutual interference of ion beams fed into the vacuum chamber through different openings and to avoid cracking of CCLs deposited on the films due to over stressing, the distance between two adjacent openings on the same wall is preferably controlled within a certain scope.

Through a large number of studies, it is found that, when the distance between two adjacent openings on the same wall is 0.75-4 times the diameter of the cooling roller, interference is not easy to occur in the ion beams fed into the vacuum chamber through different openings, and cracking is not easy to occur on CCLs deposited on the films. In another preferred embodiment, the distance between two adjacent openings on the same wall is 0.75-4, more preferably 1-3 times the diameter of the cooling roller.

In another preferred embodiment, according to the current film size, two sides of the openings axially vertical to the cooling rollers have a size of 30-100 mm; the cooling rollers have a diameter of 50-100 mm; the distance between said openings and the corresponding cooling roller axial line is 50-150 mm; the distance between two adjacent openings on the same wall is 75-200 mm.

In order to increase the bonding force between the CCLs coated on the substrate films and the films, the inventor conducts much comparison studies on the "ion implantation" technology and "magnetron sputtering" technology. The inventor deems that, when the "magnetron sputtering" technology is used to form CCLs on the substrate films, the operating principle thereof is as follows. In vacuum environment, the ionized argon ion ($Ar^+$) is used to bombard the target (copper) surface, so that atoms (copper atoms) on the target are "sputtered" (e.g. there will be spray sputtering if stones are thrown into water). The sputtered copper atoms are adsorbed and deposited onto the surface of the substrate films to form a copper clad film. In view of the technical features of the magnetron sputtering per se, copper atoms "sputtered" contain a very low energy (the highest is only several electron volts), so that they can only be adsorbed and deposited on the surface of the substrate films, to result in a lower bonding force between the resultant copper films and the substrate.

For the aforesaid reasons, the invention deems that the velocity of movement of copper atoms or copper ions to be deposited soon to the substrate films shall be necessarily increased. The inventor thus attempts to use a novel technology, i.e. applying in a groundbreaking manner the plasma deposition and/or ion implantation technology onto the metal film deposition layer on the films, so as to make 2L-FCCLs.

When the plasma deposition technology is applied, the plasma is in contact with the substrate film at a certain velocity of movement to bind thereto, which can enhance the bonding force between the metal film deposition layer deposited on the substrate film and the substrate film. In particular, when the ion implantation technology is applied, copper atoms are forcibly injected inside the substrate film, which is equivalent to placing a plurality of "foundation piles" on the substrate films. Subsequently, the "plasma deposition" process is used to deposit on the films a layer of metal film layer connected with the "foundation piles" to form a compact metal film layer having a better bonding force with the substrate, so as to further increase the bonding force between the metal film layer deposited on the substrate films and the substrate films, and to make the bonding force between the metal film layer and the substrate films be far greater than the bonding force between the metal film layer obtained by magnetron sputtering and the substrate films.

In one preferred embodiment, the process of the present invention comprises firstly conducting the step of the plasma deposition, and then the step of the continuous electrocoppering.

In order to further increase the adhesiveness between the deposited CCL and the substrate film, the inventor finds that, if ion implantation of the films is conducted firstly, and the plasma deposition is then carried out, the bonding force between the metal film layer deposited onto the films and the films will be greatly increased. Thus, in another preferred embodiment, such process comprises firstly conducting the step of ion implantation of the organic macromolecular polymer film, and then the plasma deposition, and finally the continuous electrocoppering.

Upon studies, the inventor finds that, in order to achieve higher bonding forces without destroying the substrate films, the conditions for plasma deposition and/or ion implantations shall be necessarily optimized. Upon much studies, it is found that the ion implantation and plasma deposition under the following conditions achieve a higher bonding force between the copper clad layer and the film substrate in the double-sided FCCLs. Said vacuum chamber has a vacuum degree, which may be the vacuum degree in the art, of preferably $2\times10^{-3}$-$5\times10^{-5}$ Pa; said organic macromolecular polymer film has a thickness of 3-150 μm, preferably 10-50 μm; said ion implantation is conducted under the conditions of a running speed of said organic macromolecular polymer film of 0.3-2 m/minute, an ion implantation voltage of 1-10 KV, preferably 5-10 kV, an ion implantation dosage of $0.5\times10^{13}$-$1.0\times10^{17}$ atom/$cm^2$, preferably $0.5\times10^{14}$-$5.0\times10^{16}$ atom/$cm^2$; said plasma deposition is conducted under the conditions of a running speed of said organic macromolecular polymer film of 0.3-2 m/minute and an ion beam stream of 20-80 milliampere, preferably 20-70 milliampere, most preferably 20-40 milliampere. In particular, when the ion implantation and plasma deposition are conducted in the equipment having a rectangular opening, wherein the side axially perpendicular to the cooling roller has a length of 30-100 mm; the cooling roller has a diameter of 50-100 mm; the distance between said opening and the corresponding cooling roller axial line is 50-150 mm; the distance between two adjacent openings on the same wall is 75-200 mm. Under such conditions, the plasma copper clad layer ion injected and plasma deposited has a thickness of 20-200 nm, and there is a good bonding force between the copper clad layer and the substrate film.

In this way, the ion implantation has a depth of about 1.0-10 nm; the injection dosage reaches a magnitude as high as $10^{17}$ atoms/$cm^2$ (there are about $9.48\times10^{21}$ atoms in 1 g of copper). This is equivalent to a great amount of foundation piles placed in the substrate films. Subsequently, the "plasma deposition" process is used to deposit a thin layer of copper layer on the surface thereof so as to bind the copper layer deposited on the surface of the substrate film to the "foundation piles" embedded inside the substrate films and to greatly increase the bonding force (peeling strength) between the metal film layer deposited thereon and the substrate film surface.

In another preferred embodiment, in order to further increase the bonding force between the metal film layer and the substrate film, Said vacuum chamber has a vacuum degree, which may be the vacuum degree in the art, of preferably $2\times10^{-3}$-$5\times10^{-5}$ Pa; said organic macromolecular polymer film has a thickness of 10-50 μm; said ion implantation is conducted under the conditions of a running speed of said organic macromolecular polymer film of 0.3-2 m/minute, an ion implantation voltage of 5-10 kV, an ion implantation dosage of $0.5\times10^{14}$-$5.0\times10^{16}$ atom/$cm^2$; said plasma deposition is conducted under the conditions of a running speed of said organic macromolecular polymer film of 0.3-2 m/minute and an ion beam stream of 20-40 milliampere.

In order to increase the bonding force between the metal film layer plasma deposited thereon and the substrate film surface, the inventor finds that the slight addition of a negative voltage before the ion bean is fed into the vacuum chamber increases the running speed of the ion beam, so as to achieve a better bonding force. In one preferred embodiment, the conditions for said plasma deposition further comprises a plasma deposition voltage of 100-500V, preferably 100-300V.

Said organic macromolecular polymer film may be any organic macromolecular polymer film in the art, such as polyimide (PI) films, polyphenylene oxide (PTO) films, polycarbonate (PC) films, polysulfone (PSU) films, polyethersulfone (PES) films, polyphenylene sulfide (PPS) films, polystyrene (PS) films, polyethylene (PE) films, polypropylene (PP) films, polyether imide (PEI), polytetrafluoroethylene (PTFE) films, polyether ether ketone (PEEK) films, polyamide (PA), polyethylene terephthalate (PET) films, liquid crystal polymer (LCP) films, or polyparabanic acid (PPA) films and the like. Preferably, polyimide (PI) films, polyethylene terephthalate (PET) films, liquid crystal polymer (LCP) films, or polyparabanic acid (PPA) films are suitable as the films of the FCCL dielectric materials.

In another preferred embodiment, the substance ion injected and plasma deposited is a metal which is one or more selected from the group consisting of chromium, nickel, copper, and molybdenum.

In the present invention, the continuous electroplating steps can be carried out in the current electroplating equipment capable of conducting the continuous electrocoppering, e.g. in the continuous electroplating equipment mentioned in CN101350315A, preferably in the following electroplating equipment comprising a unreeling machine, a wind up machine, at least one main electroplating bath, a first conductor roll group even-even horizontally disposed and parallel to each other, and a rectifier; said main electroplating bath is non-horizontally equipped with a first anode group in which said even-even are parallel to each other; each pair of anodes in said first anode group are two anodes adjacently disposed; each anode in the first anode group is connected with the anode of the rectifier; at least one first guide roller group parallel to the conductor roller in the first conductor roller group; the guide roller of the first guide roller group is disposed below the lowest level of the anode of the first anode group to guide the operation of the film in said main electroplating bath; the conductor roller of the first conductor roller group is disposed at a position above the main electroplating bath and corresponding to the anode of the first anode group; each pair of the conductor rollers in the first conductor roller group are connected with the cathode of the rectifier; each pair of the conductor rollers in the first conductor roller group are two conductor rollers adjacently disposed and used in turn for being in contact with the films fed into the main electroplating bath and the film discharged from said main electroplating bath.

In the present invention, the cathode of the rectifier is connected with each pair of the conductor rollers of the first conductor roller group, and the other end is connected with the electric machine or the external power grid. The cathode of the rectifier is connected with each pair of the conductor rollers of the first conductor roller group in the manner that the cathode of the rectifier is connected only with either of the conductor rollers in each pair of the conductor rollers, or both conductor rollers in each pair of the conductor rollers, so as to conduct the single-sided or double-sided continuous electroplating of the films. Certainly, in order to achieve the single-sided or double-sided continuous electroplating of the films, other manners can also be used. For example, when the cathode of the rectifier is connected with both conductor rollers in each pair of the conductor rollers of the first conductor roller group, the switch of the rectifier can be controlled to achieve the single-sided and double-sided electroplating, or the distance between two conductor rollers in each pair of the conductor rollers of the first conductor roller group is adjusted to make either or both of two conductor rollers in each pair of the conductor rollers being in contact with one or both surfaces of the films which pass therethrough. In addition, while electroplating two surfaces of the films, the current strength outputted from the rectifier can be controlled in order to control the thickness of the CCLs deposited on both surfaces of said films, so as to make the thicknesses of the CCLs deposited on both surfaces of said films the same or different from each other.

In the present invention, the pair amount of the conductor rollers of the first conductor roller group, the pair amount of the anodes of the first anode group, and the amount of the guide rollers of the first guide roller group may be set up according to the actual requirements. Said first conductor roller group, the anode of the first anode group and the guide rollers of the first guide roller group may be disposed in one or more said electroplating baths.

The number of rollers of the first guide roller group may be determined according to the actual requirements and the diameter size of the rollers of the first guide roller group, so as to make the guide rollers of the first guide roller group lead the operation of the films in said main electroplating bath. For example, if the rollers of the first guide roller group have a greater diameter size, one roller of the first guide roller group may be set up between the first and second pairs of anodes of the first anode group; one roller of the first guide roller group may be set up between the third and four pairs of anodes of the first anode group, and so on. If the rollers of the first guide roller group have a smaller diameter size, two rollers of the first guide roller group may be set up between the first and second pairs of anodes of the first anode group; two rollers of the first guide roller group may be set up between the third and four pairs of anodes of the first anode group, and so on.

The vertical distance between each pair of the conductor rollers in the first conductor roller group and the main electroplating bath may be fixed or adjustable. In one preferred embodiment, the vertical distance between each pair of the conductor rollers in the first conductor roller group and the main electroplating bath is adjustable, so as to adjust the vertical distance between each pair of the conductor rollers in the first conductor roller group and the main electroplating bath as required.

The distance between two adjacent conductor rollers of each pair in the first conductor roller group may be fixed or adjustable. In one preferred embodiment, the distance between two adjacent conductor rollers of each pair in the first conductor roller group is adjustable, so as to be convenient to adjusting the distance between two adjacent conductor rollers as required.

While continuously electrocoppering the films with said electroplating equipment, the film rolls are firstly placed on said unreeling machine to pass one end of the films through the interspace between the first pair of conductor rollers of the first conductor roller group in order, then through the interspace between the first pair of anodes of the first anode group, through the guide rollers of the first guide roller group, through the interspace between the second pair of anodes of the first anode group . . . finally wrapped on said wind up machine. Alternatively, the film rolls are firstly placed on said unreeling machine to make one end of the films enter the main electroplating bath, pass through the guide rollers of the first guide roller group, then through the interspace between the first pair of anodes of the first anode group, through the first pair of the guide rollers of the first guide roller group, through the guide rollers of the first guide roller group, through the interspace between the second pair of anodes of the first anode group . . . finally wrapped on said wind up machine. Said unreeling machine and wind up machine are driven manually or by mechanical force to rotate to make the films continuously proceed forward. Preferably, said unreeling machine and wind up machine are respectively connected with the electric machines to make said unreeling machine and wind up machine rotate at substantially the same speed by adjusting the rotating speed of the electric machines.

In one preferred embodiment, each lateral surface of each of two conductor rollers of each pair of conductor rollers in said first conductor roller group is respectively in contact with two surfaces of the films therebetween, so as to electroplate two surfaces of the films at the same time.

In one preferred embodiment, a second guide roller group parallel to the guide rollers of the first guide roller group is disposed above the main electroplating bath. Moreover, the guide rollers in the first guide roller group and the guide rollers in the second guide roller group are alternately disposed between each two adjacent pairs of conductor rollers in said first conductor roller group, so as to be advantageous to the operation of the films. The rollers of the first guide roller group may have the same or different diameters from those of the second guide roller group. In another preferred embodiment, when said main electroplating bath has a greater size, the rollers of the first and second guide roller groups have the same great diameter; one guide roller of the first and second guide roller groups is alternately disposed between each two adjacent pairs of conductor rollers in said first conductor roller group, so as to make the equipment simpler. In another preferred embodiment, when said main electroplating bath has a less size, the rollers of the first guide roller group have a less diameter, and the second guide rollers have a greater diameter. Two first guide rollers and one second guide roller are alternately disposed between each two adjacent pairs of conductor rollers in said first conductor roller group.

In one preferred embodiment, there are two to eight main electroplating baths, so as to flexibly achieve different electroplating objects by controlling the ingredients of the plating solution in the main electroplating bath, e.g. plating different CCLs. In another preferred embodiment, there are two to eight main electroplating baths, wherein the third guide rollers are disposed between two adjacent main electroplating baths and are in parallel to the conductor rollers in the first conductor roller group. Such preferred embodiments are more advantageous to the operation of the films in different main electroplating baths.

In one preferred embodiment, there are two main electroplating baths in each of which there is one guide roller in the first guide roller group; the anode in the first anode group is vertically disposed; there are two pairs of the anodes in said first anode group and the conductor rollers in said first conductor roller group.

In one preferred embodiment, said unreeling machine and wind up machine are respectively connected with the electric machine to adjust the rotating speed of the electric machine so as to control the rotating speeds of the unreeling machine and wind up machine.

In one preferred embodiment, in order to make the films operate at a higher speed, each conductor roller of the first conductor roller groups is respectively connected with a transmission unit, such transmission unit being able to making each conductor roller of the first conductor roller groups corotating or contrarotating at the same running speed. Said transmission unit may be any one useful for the invention in the art, e.g. chains and gears, preferably an electric machine-driven turbine worm gear unit, so as to better control the running speed of the films. The electroplating equipment of the present invention preferably further comprises at least one pre-electroplating bath and one second conductor roll group odd-paired horizontally disposed and parallel to each other; the conductor rollers in said second conductor roller group are parallel to the conductor roller in said first conductor roller group; said pre-electroplating bath is non-horizontally equipped with a second anode group in which said odd-paired are parallel to each other; each pair of anodes in said second anode group are two anodes adjacently disposed; each anode in the first anode group is connected with the anode of the rectifier; at least one second guide roller group, the guide roller of which is parallel to the conductor roller in the second conductor roller group; the second guide roller group is disposed below the lowest level of the second anode to guide the operation of the film in said pre-electroplating bath; the conductor roller of the second conductor is disposed at a position above the pre-electroplating bath and corresponding to the anode of the second anode group; each pair of the conductor rollers in the second conductor roller group are connected with the cathode of the rectifier; each pair of the conductor rollers in the second conductor roller group are two conductor rollers adjacently disposed and used in turn for being in contact with the films fed into the pre-electroplating bath and the film discharged from said pre-electroplating bath; a fourth guide roller being disposed between the pre-electroplating bath and said main electroplating bath and disposed parallel to the conductor rollers in the first conductor roller group.

The current strength in the pre-electroplating bath is not homogeneously distributed, and the current strength is gradually decreased from the uppermost to the lowest of the anode. The films are electroplated from the lower end of the first and second anodes at which the current strength is low, so that the films coated with CCLs not homogeneously distributed will not readily generate sparks to destroy the films.

In one preferred embodiment, each lateral surface of each of two conductor rollers of each pair of conductor rollers in said second conductor roller group is respectively in contact with two surfaces of the films therebetween, so as to treat two surfaces of the films at the same time.

In one preferred embodiment, in order to simplify the structure of the pre-electroplating bath, there are two guide rollers in said second guide roller group; the anode of said second anode group is a pair of anodes vertically disposed; and there is one pair of the conductor rollers in the second conductor roller group.

In one preferred embodiment, a fifth guide roller is set up above the pre-electroplating bath and in parallel to the second guide roller. Moreover, the second guide roller and said fifth guide roller are alternately disposed between each two adjacent pairs of conductor rollers in said second conductor roller group, so as to be advantageous to the operation of the films.

In one preferred embodiment, in order to make the films operate at a higher speed, each conductor roller of the first and/or second conductor roller groups is respectively connected with a transmission unit, such transmission unit being able to making each conductor roller of the first and second conductor roller groups corotating or contrarotating at the same running speed.

Said transmission unit may be any one useful for the invention in the art, e.g. chains and gears, preferably an electric machine-driven turbine worm gear unit, so as to better control the running speed of the films.

The vertical distance between each pair of the conductor rollers in the second conductor roller group and the main electroplating bath may be fixed or adjustable. In one preferred embodiment, the vertical distance between each pair of the conductor rollers in the second conductor roller group and the main electroplating bath is adjustable, so as to be convenient to adjusting the vertical distance between each pair of the conductor rollers in the second conductor roller group and the main electroplating bath as required.

The distance between two adjacent conductor rollers in the second conductor roller group may be fixed or adjustable. In one preferred embodiment, the distance between two adjacent conductor rollers in the second conductor roller group is adjustable, so as to be convenient to adjusting the distance between two adjacent conductor rollers as required.

In one preferred embodiment, a third guide roller is further set up at one side above the pre-electroplating bath and adjacent to the unreeling machine, and is parallel to the conductor rollers in the second guide roller group so as to be advantageous to the operation of films.

In one preferred embodiment, in order to wash the plating solution on the films after electroplating, such electroplating equipment further comprises a water washing bath equipped with at least one fourth guide roller, wherein a sixth guide roller is set up between said main electroplating bath and said water washing bath; said fourth guide roller and said sixth guide roller both set up in parallel to the conductor rollers in the first guide roller group.

In one preferred embodiment, in order to prevent copper oxidation, such electroplating equipment has two water washing baths, and a passivation bath between said two water washing baths, wherein at least one fifth guide roller is equipped in the passivation bath; a seventh guide roller is equipped between said water washing baths and said passivation bath; said fifth guide roller and said seven guide roller are set up in parallel to the conductor rollers in the first guide roller group.

In one preferred embodiment, in order to dry water on the CCLs as soon as possible, such electroplating equipment further comprises setting up a drying oven after the last water washing bath, a eighth guide roller between said drying oven and the water washing bath, wherein said eighth guide roller is set up in parallel to the conductor rollers in the first guide roller group.

The electroplating equipment preferably comprises said main electroplating bath and pre-electroplating bath. The electroplating equipment comprises a unreeling machine, a wind up machine, at least one main electroplating bath, a first conductor roll group even-even horizontally disposed and parallel to each other, and a rectifier; said main electroplating bath is non-horizontally equipped with a first anode group in which said even-even are parallel to each other; each pair of anodes in said first anode group are two anodes adjacently disposed; each anode in the first anode group is connected with the anode of the rectifier; at least one first guide roller group parallel to the conductor roller in the first conductor roller group; the guide roller of the first guide roller group is disposed below the lowest level of the anode of the first anode group to guide the operation of the film in said main electroplating bath; the conductor roller of the first conductor roller group is disposed at a position above the main electroplating bath and corresponding to the anode of the first anode group; each pair of the conductor rollers in the first conductor roller group are connected with the cathode of the rectifier; each pair of the conductor rollers in the first conductor roller group are two conductor rollers adjacently disposed and used in turn for being in contact with the films fed into the main electroplating bath and the film discharged from said main electroplating bath; said electroplating equipment further comprises at least a pre-electroplating bath and a second conductor roll group odd-paired horizontally disposed and parallel to each other; the conductor rollers in said second conductor roller group are parallel to the conductor roller in said first conductor roller group; said pre-electroplating bath is non-horizontally equipped with a second anode group in which said odd-paired are parallel to each other; each pair of anodes in said second anode group are two anodes adjacently disposed; each anode in the first anode group is connected with the anode of the rectifier; at least one second guide roller group, the guide roller of which is parallel to the conductor roller in the second conductor roller group; the second guide roller group is disposed below the lowest level of the second anode to guide the operation of the film in said pre-electroplating bath; the conductor roller of the second conductor is disposed at a position above the pre-electroplating bath and corresponding to the anode of the second anode group; each pair of the conductor rollers in the second conductor roller group are connected with the cathode of the rectifier; each pair of the conductor rollers in the second conductor roller group are two conductor rollers adjacently disposed and used in turn for being in contact with the films fed into the pre-electroplating bath and the film discharged from said pre-electroplating bath; a fourth guide roller being disposed between the pre-electroplating bath and said main electroplating bath and disposed parallel to the conductor rollers in the first conductor roller group.

In one preferred embodiment, there are two main electroplating baths in each of which there is one guide roller in the first guide roller group; said first anode is vertically disposed; there are two pairs of said first anode groups and said first conductor roller groups; there are two second guide roller groups; said second anodes are a pair of anodes vertically disposed; there are one pair of the second conductor roller groups; a third guide roller is disposed at one side adjacent to the unreeling machine above the pre-electroplating bath, and parallel to the conductor roller in the second conductor roller group.

In another preferred embodiment, each conductor roller of the first and second conductor roller groups is respectively connected with the transmission unit which can make each conductor roller of the first and second conductor roller groups corotating or contrarotating at the same running speed In another preferred embodiment, the vertical distance between each pair of the conductor rollers of the first conductor roller group and the main electroplating bath can be adjusted; the distance between two conductor rollers adjacent to each other in said first conductor roller group can be adjusted; the vertical distance between each pair of the conductor rollers of the second conductor roller group and the pre-electroplating bath can be adjusted; the distance between two conductor rollers adjacent to each other in said second conductor roller group can be adjusted.

In one preferred embodiment, such process comprises the pre-electroplating and main electroplating steps, adjusting the vertical distance between the conductor rollers of the first and second conductor roller groups and the surface of the plating solution in the main electroplating bath and the pre-electroplating bath, so as to make the vertical distance between the lowest level surface of the external surface of each pair of the conductor rollers of the first and second conductor roller groups and the surface of the plating solution be 3-20 mm. Such embodiment can reduce the current loss during the conduction process.

In another preferred embodiment, the pre-plating may be conducted under any pre-plating conditions, preferably an electroplating temperature of 20-28° C., an average cathode current density of 10-40, preferably 15-25 ampere/decimeter$^2$, and a running speed of the film of 10-50 m/h, preferably 15-30 m/h; the main plating may be conducted under any main plating conditions, preferably an electroplating temperature of 20-28° C., an average cathode current density of 2-15 ampere/decimeter$^2$, preferably 5-10 ampere/decimeter$^2$, and a running speed of the film of 10-50 m/h, preferably 15-30 m/h. The electroplating according to such embodiment makes the CCLs deposited on the films very homogenous and compact.

In another preferred embodiment, the pre-plating is conducted under the conditions of an electroplating temperature of 20-25° C., an average cathode current density of 15-25 ampere/decimeter$^2$, and a running speed of the film of 15-30 m/h; the main plating is conducted under the conditions of an electroplating temperature of 20-25° C., an average cathode current density of 5-10 ampere/decimeter$^2$, and a running speed of the film of 15-30 m/h. The electroplating under such conditions makes the CCLs deposited on the films more homogenous and compact.

In one preferred embodiment of the present invention, the electroplating solution for electroplating may be any electrocoppering solution in the art, preferably a solution comprising 60-150 g/l of copper sulphate, 60-150 g/l of sulphuric acid, 0.1-0.3 ml/l of hydrochloric acid and 5-15 ml/l of additives. The additives may be any additives in the art, preferably the acidic bright copper plating additives having a trade name of 210 from Guangzhou Atotech Company, so as to make the deposited CCLs have a better flattening and flexibility. The plating solutions in the main plating bath and the pre-plating bath may be the same or different, preferably different from each other.

In another preferred embodiment of the present invention, such process further comprises passivating after electroplating. Said passivation may be conducted under any applicable passivation conditions in the art, preferably a passivation temperature of 20-30° C., a film running speed of 10-50 m/h. The passivation solution used for passivation may be any passivation solution used in the art, preferably an aqueous an aqueous solution comprising 0.2-5 g/l of benzotriazole, e.g LT-02 antirust passivation agent from Guangzhou Liangdi Chemicals.

After electroplating, said films are washed with a solution which may be any solution in the art for washing, preferably water. After water washing, the films may be air dried, or dried at a temperature for drying films in the art, preferably of 100-120° C.

The present invention is detailedly stated by the following examples.

Figure 2:
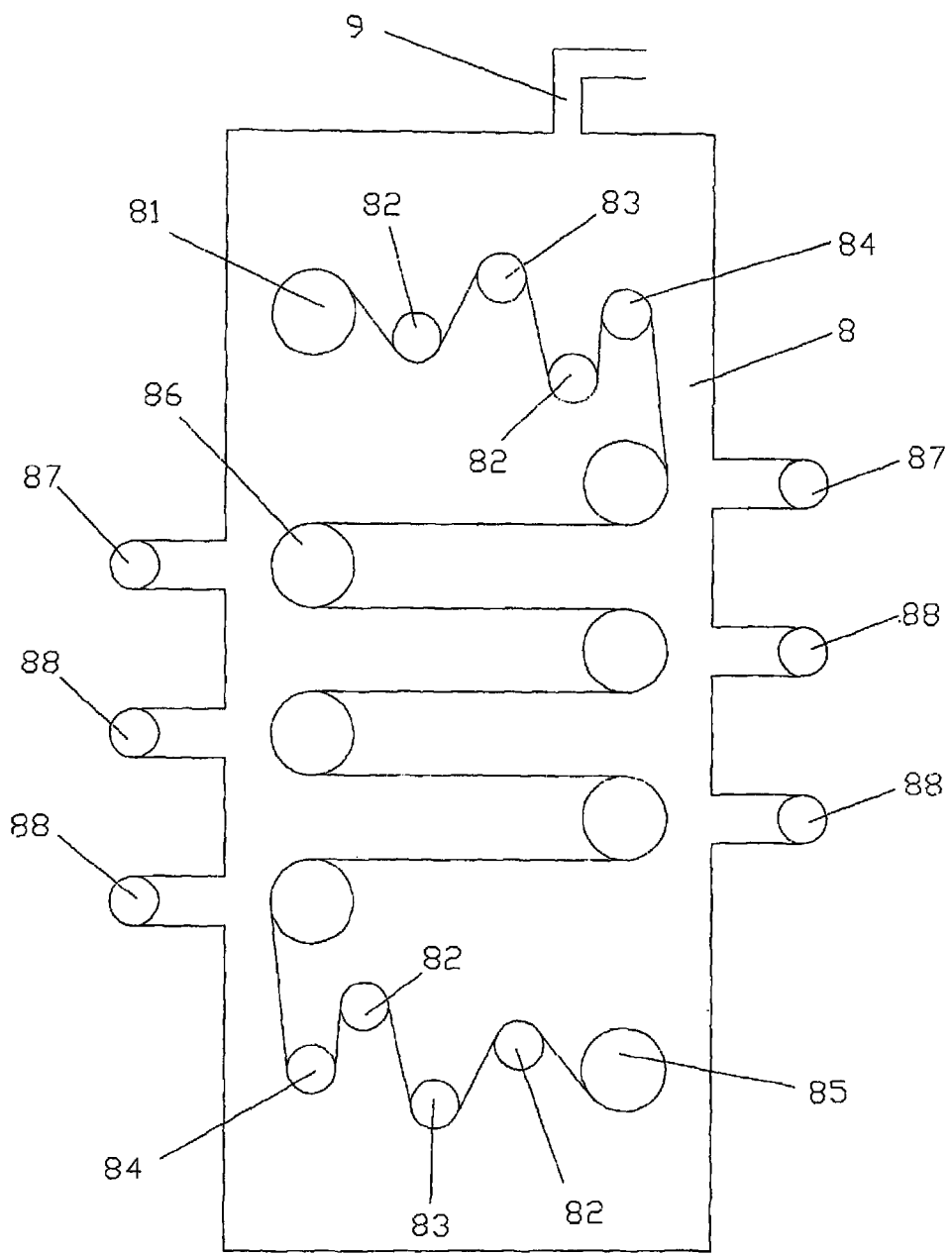
FIG. 2 shows the schematic diagram of the vacuum chamber of an ion implantation and plasma deposition equipment used by the processes of the invention.

The continuous ion implantation and/or plasma deposition steps of the process provided by the present invention are conducted in the following equipment for ion implantation and plasma deposition of films, wherein the ion source of the equipment is the magnetic filter vacuum arc ion source (as shown in FIG. 1); the vacuum chamber part is shown in FIG. 2.

The vacuum chamber part 8 is equipped with an unreeling roller 81, a transition wheel 82, a tension adjusting roller 83, a traction wheel, a wind up roller 85, a cooling roller 86, an opening 87 for ion implantation, an opening 88 for plasma deposition, and a vacuum orifice 9.

The openings for ion implantation and for plasma deposition are connected respectively with magnetic filter vacuum arc ion source, wherein there is a voltage (not shown) applying for accelerating the ion beam stream emitted from the ion source between the openings 87 and 88 and the vacuum orifice 9. Said openings are in a rectangular form, wherein the size axially vertical to said cooling roller has a length of 50 mm, and the size in the other direction has a length of 265 mm. The axis of said cooling roller has a diameter of 70 mm, and the distance between the openings thereof and the corresponding cooling roller axial line is 85 mm. The distance between two adjacent openings on the same wall is 105 mm.

Figure 3:
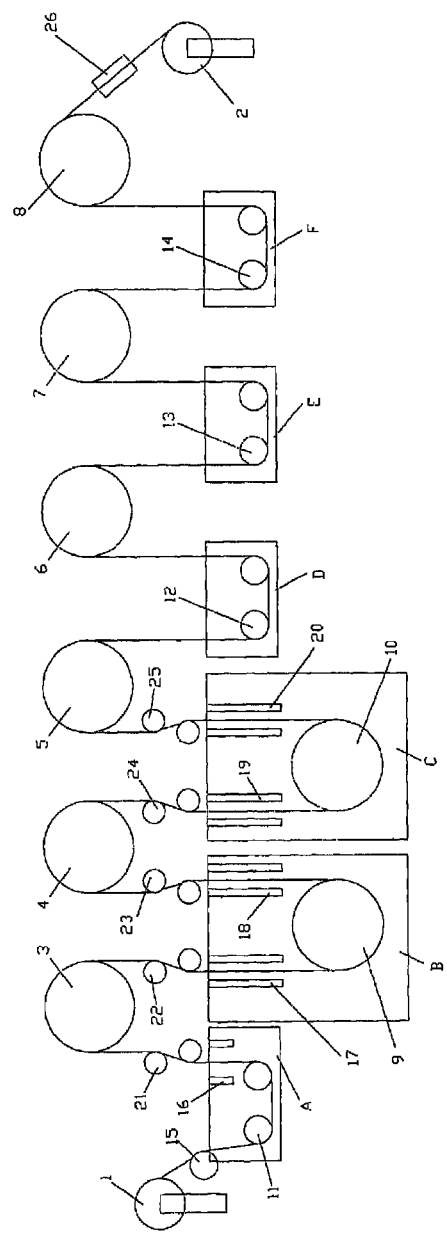
FIG. 3 shows the schematic diagram of a continuous electroplating equipment used by the processes of the invention.

In one preferred embodiment, said continuous electroplating steps of the process provided by the present invention are conducted in the following electroplating equipment as shown in FIG. 3, comprising a pre-electroplating bath, a main electroplating bath B, a main electroplating bath C, a water washing bath D, a passivation bath E and a water washing bath F, a unreeling machine 1, a wind up machine 2, a fourth guide roller 3, a third guide roller 4, a sixth guide roller 5, a seventh guide roller 6, a seventh guide roller 7, a eighth guide roller 8, a first guide roller group 9, a first guide roller group 10, a drying oven between the wind up roller 2 and the eighth guide roller 8; a second guide roller 11, a fourth guide roller 12, a fourth guide roller 14, a fifth guide roller 13, a third guide roller 15; a second anode group 16, a first anode group 17, a first anode group 18, a first anode group 19, a first anode group 20; a second conductor roller group 21, a first conductor roller group 22, a first conductor roller group 23, a first conductor roller group 24 and a first conductor roller group 25.

Figure 4:
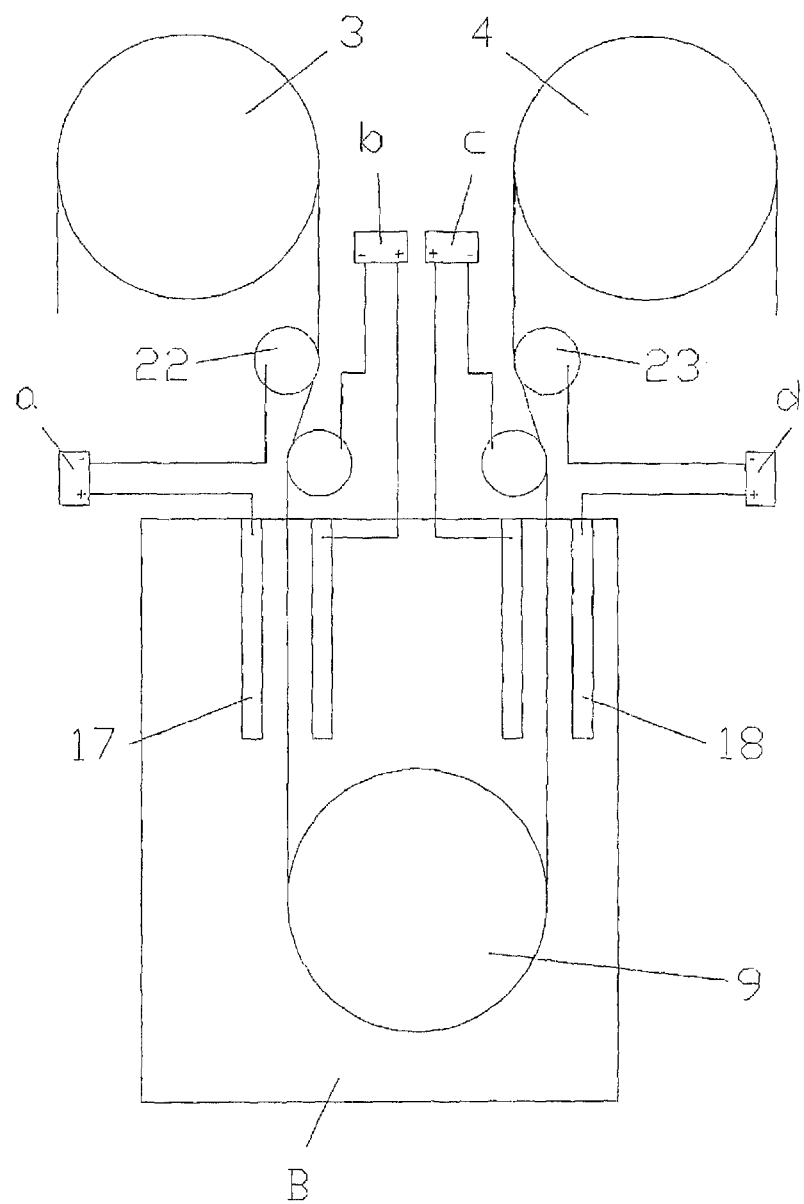
FIG. 4 shows the magnified schematic diagram of the continuous electroplating equipment as shown in FIG. 3.

As shown in FIG. 4, the continuous electroplating equipment provided in the present invention further comprises a rectifier a, a rectifier b, a rectifier c and a rectifier connected with the first anode group, second anode group, first conductor roller and second conductor roller.

Such continuous electroplating equipment further comprises a transmission unit (not shown) respectively connected with each conductor roller of the first and second conductor roller groups, such transmission unit being able to making each conductor roller of the first and second conductor roller groups corotating or contrarotating at the same running speed. Said transmission unit is an electric machine-driven turbine worm gear unit. In addition, such electroplating equipment further comprises the electric machines respectively connected with said unreeling machine and wind up machine.

During the electroplating, the films to be treated are placed on the unreeling machine 1; one end of the films passes in turn a third guide roller 15, a second guide roller 11, a second conductor roller group 21, a fourth guide roller 3, a first conductor roller group 22, a first guide roller group 9, a first conductor roller group 23, a third guide roller 4, a first conductor roller group 24, a first guide roller group 10, a first conductor roller group 25, a sixth guide roller 5, a fourth guide roller 12, a seventh guide roller 6, a fifth guide roller 13, a seventh guide roller 7, a fourth guide roller 14, a eighth guide roller 8, a driving oven 26 and is finally wrapped on the wind up roller 2. The electroplating solution is injected into the electroplating bath and each main electroplating bath; each electric machine starts; the rotating speed of the electric machine is regulated to make the film running at the required speed.

EXAMPLE 1

Deposited Copper Films (Injected Copper+Deposited Copper) Having a Thickness of 25 Nm at Each Side of the PI Films, then Electroplating a Copper Layer Having a Thickness of 12 μm Experimental process: (1) placing a roll of PI films (having a thickness of 0.025 mm and a width of 270 mm) on the unreeling roller, passing one end of the PI films through the tension adjusting unit, all cooling rollers, the tension adjusting unit in turn, and finally fixing on the wind up roller; feeding the cooling water having a temperature of 0-10° C. into the cooling roller, vacuating to have a vacuum degree of $5 \times 10^{-4}$ Pa; turning on the ion source and the accelerating voltage, so make the PI films have a running speed of 2 m/minute.
- (2) Ion implantation and deposition: a copper ion source is used therein, wherein the ion implantation voltage is 5 KV; the injection dosage is $3 \times 10^{14}$ atoms/cm$^2$; the plasma deposition voltage is 0.2 KV; the ion beam stream is 40 milliampere; the copper film on the resultant films has a thickness of 25 nm of copper clad layer.
- (3) electroplating: In the pre-electroplating bath, the pre-plating solution has a temperature of 25° C. and an average cathode current density of 15 amperes/dm$^2$, and comprises 60 g/l of copper sulfate, 100 g/l of sulfuric acid, 0.2 ml/l of hydrochloric acid, 10 ml/l of Atotech 210 plating bath agent, 0.8 ml/l of Atotech 210A, and 0.6 ml/l of Atotech 210 B. In the main electroplating bath, the electroplating solution has a temperature of 25° C. and an average cathode current density of 3.9 amperes/dm$^2$, and comprises 60 g/l of copper sulfate, 100 g/l of sulfuric acid, 0.15 ml/l of hydrochloric acid, 10 ml/l of Atotech 210 plating bath agent, 0.8 ml/l of Atotech 210A, and 0.6 ml/l of Atotech 210 B. The films have a running speed of 10 m/minute.

After the electroplating, the films pass the rinsing bath filled with water for washing, are passivated in a passivation bath, and are washed in a rinsing bath filled with water, pass through a dryer to dry the films at a temperature of 10° C. said passivation conditions comprise a passivation temperature of 25° C., and a running speed of the films of 10 m/h. The passivation solution is an aqueous solution comprising 0.2 g/l of benzotriazole (LT-02 from Guangzhou Liangdi Chemicals).

A copper layer having a thickness of 12 μm is electroplated and deposited, and the copper layer is compact and smooth.

EXAMPLE 2

Depositing 200 Nm Copper Films (Injected Copper+Deposited Copper) at Each Side of the PI Films, then Electroplating a Copper Layer Having a Thickness of 12 μm Experimental process: (1) except for the running speed of PI film of 0.3 m/minutes, other operations all are the same as those in step (1) of Example 1.
- (2) Ion implantation and deposition: a copper ion source is used therein, wherein the ion implantation voltage is 6 KV; the injection dosage is $1 \times 10^{16}$ atoms/cm$^2$; the plasma deposition voltage is 0.3 KV; the ion beam stream is 70 milliampere; the copper film (injected copper+deposited copper) on the resultant films has a thickness of 200 nm.
- (3) electroplating: In the pre-electroplating bath, the pre-plating solution has a temperature of 20° C. and an average cathode current density of 25 amperes/dm$^2$, and comprises 150 g/l of copper sulfate, 60 g/l of sulfuric acid, 0.1 ml/l of hydrochloric acid, 5 ml/l of an plating bath agent, 0.5 ml/l of Atotech 210A, and 0.3 ml/l of Atotech 210 B. In the main electroplating bath, the electroplating solution has a temperature of 20° C. and an average cathode current density of 15 ampere/dm$^2$, and comprises 120 g/l of copper sulfate, 80 g/l of sulfuric acid, 0.15 ml/l of hydrochloric acid, 7 ml/l of Atotech 210 plating bath agent, 0.6 ml/l of Atotech 210A, and 0.5 ml/l of Atotech 210 B. The films have a running speed of 50 m/minute.

After the electroplating, the films pass the rinsing bath filled with water for washing, are passivated in a passivation bath, and are washed in a rinsing bath filled with water, pass through a dryer to dry the films at a temperature of ° C. Said passivation conditions comprise a passivation temperature of 20° C., and a running speed of the films of 50 m/h. The passivation solution is an aqueous solution comprising 1 g/l of benzotriazole (LT-02 from Guangzhou Liangdi Chemicals).

A copper layer having a thickness of 7 μm is electroplated and deposited, and the copper layer is compact and smooth.

EXAMPLE 3

Depositing Metal Films (Injecting Nickel+Deposited Nickel+Deposited Copper) Having a Thickness of 100 Nm at Each Side of the PI Films Experimental process: (1) except for the running speed of PI film of 0.4 m/minutes, other operations all are the same as those in step (1) of Example 2.
- (2) Ion implantation and deposition: four nickel ion sources and two copper ion sources are used therein, wherein the nickel ion implantation voltage is 6 KV; the injection dosage is $3 \times 10^{14}$ atoms/cm$^2$; under the following conditions, the nickel plasma deposition and copper plasma deposition are carried out at a voltage of 0.2 KV; the ion beam stream is 40 milliampere; the metal film (injecting nickel+deposited nickel+deposited copper) on the resultant films has a thickness of 100 nm.
- (3) electroplating: In the pre-electroplating bath, the pre-plating solution has a temperature of 22° C. and an average cathode current density of 30 amperes/dm2, and comprises 150 g/l of copper sulfate, 80 g/l of sulfuric acid, 0.2 ml/l of hydrochloric acid, 7 ml/l of an plating bath agent, 0.7 ml/l of Atotech 210A, and 0.5 ml/l of Atotech 210 B. In the main electroplating bath, the electroplating solution has a temperature of 22° C. and an average cathode current density of 17 ampere/dm$^2$, and comprises 100 g/l of copper sulfate, 100 g/l of sulfuric acid, 0.2 ml/l of hydrochloric acid, 11 ml/l of an plating bath agent, 0.9 ml/l of Atotech 210A, and 0.7 ml/l of Atotech 210 B. The films have a running speed of 40 m/minute.

After the electroplating, the films pass the rinsing bath filled with water for washing, are passivated in a passivation bath, and are washed in a rinsing bath filled with water, pass through a dryer to dry the films at a temperature of 120° C. Said passivation conditions comprise a passivation temperature of 22° C., and a running speed of the films of 40 m/h. The passivation solution is an aqueous solution comprising 3 g/l of benzotriazole (LT-02 from Guangzhou Liangdi Chemicals).

A copper layer having a thickness of 9 μm is electroplated and deposited, and the copper layer is compact and smooth.

EXAMPLE 4

Depositing Metal Films (Injected Chromium+Deposited Chromium+Deposited Copper) Having a Thickness of 50 Nm at Each Side of the PET Films Experimental process: (1) except for the running speed of PET film of 0.6 m/minutes, other operations all are the same as those in step (1) of Example 2.
(2) Four chromium ion sources and two copper ion sources are used therein, wherein the chromium ion implantation voltage is 6 KV; the injection dosage is $3 \times 10^{14}$ atoms/$cm^2$; under the following conditions, the chromium plasma deposition and copper plasma deposition are carried out at a voltage of 0.5 KV; the ion beam stream is 20 milliampere; the metal film on the resultant films has a thickness of 50 nm, and the metal layer has a homogeneous and compact structure.
(3) electroplating: In the pre-electroplating bath, the pre-plating solution has a temperature of 28° C. and an average cathode current density of 20 amperes/$dm^2$, and comprises 100 g/l of copper sulfate, 150 g/l of sulfuric acid, 0.2 ml/l of hydrochloric acid, 10 ml/l of an plating bath agent, 0.8 ml/l of Atotech 210A, and 0.6 ml/l of Atotech 210 B. In the main electroplating bath, the electroplating solution has a temperature of 28° C. and an average cathode current density of 12 ampere/dm2, and comprises 80 g/l of copper sulfate, 60 g/l of sulfuric acid, 0.15 ml/l of hydrochloric acid, 10 ml/l of Atotech 210 plating bath agent, 0.8 ml/l of Atotech 210A, and 0.6 ml/l of Atotech 210 B. The films have a running speed of 20 m/minute.

After the electroplating, the films pass the rinsing bath filled with water for washing, are passivated in a passivation bath, and are washed in a rinsing bath filled with water, pass through a dryer to dry the films at a temperature of 100° C. Said passivation conditions comprise a passivation temperature of 30° C., and a running speed of the films of 20 m/h. The passivation solution is an aqueous solution comprising 0.5 g/l of benzotriazole (LT-02 from Guangzhou Liangdi Chemicals).

A copper layer having a thickness of 12 μm is electroplated and deposited, and the copper layer is compact and smooth.

EXAMPLE 5

Depositing Metal Films (Injected Copper+Deposited Nickel+Deposited Copper) Having a Thickness of 50 Nm at Each Side of the PI Films Experimental process: (1) except for the running speed of PET film of 0.8 m/minutes, other operations all are the same as those in step (1) of Example 2.
(2) Two nickel ion sources and four copper ion sources are used therein, wherein the chromium ion implantation voltage is 5 KV; the injection dosage is $3 \times 10^{13}$ atoms/$cm^2$; the nickel plasma deposition and copper plasma deposition are carried out subsequently at a voltage of 0.4 KV; the ion beam stream is 30 milliampere; the metal film on the resultant films has a thickness of 50 nm, and the metal layer has a homogeneous and compact structure.
(3) electroplating: In the pre-electroplating bath, the pre-plating solution has a temperature of 24° C. and an average cathode current density of 40 amperes/$dm^2$, and comprises 150 g/l of copper sulfate, 120 g/l of sulfuric acid, 0.2 ml/l of hydrochloric acid, 8 ml/l of an plating bath agent, 0.6 ml/l of Atotech 210A, and 0.7 ml/l of Atotech 210 B. In the main electroplating bath, the electroplating solution has a temperature of 24° C. and an average cathode current density of 21 ampere/$dm^2$, and comprises 120 g/l of copper sulfate, 150 g/l of sulfuric acid, 0.3 ml/l of hydrochloric acid, 12 ml/l of an plating bath agent, 0.9 ml/l of Atotech 210A, and 0.8 ml/l of Atotech 210 B. The films have a running speed of 30 m/minute.

After the electroplating, the films pass the rinsing bath filled with water for washing, are passivated in a passivation bath, and are washed in a rinsing bath filled with water, pass through a dryer to dry the films at a temperature of 120° C. Said passivation conditions comprise a passivation temperature of 24° C., and a running speed of the films of 30 m/h. The passivation solution is an aqueous solution comprising 5 g/l of benzotriazole (LT-02 from Guangzhou Liangdi Chemicals).

A copper layer having a thickness of 12 μm is electroplated and deposited, and the copper layer is compact and smooth.

EXAMPLE 6

Depositing Metal Films (Deposited Nickel+Deposited Copper) Having a Thickness of 50 Nm at Each Side of the PI Films Experimental process: (1) except for the running speed of PI film of 0.5 m/minutes, other operations all are the same as those in step (1) of Example 2.
(2) directly conducting the nickel plasma deposition without ion implantation, subsequently the copper plasma deposition at a deposition voltage of 0.2 KV, wherein the ion beam stream is 20 milliampere. The metal film of the resultant films has a thickness of about 50 nm, and the metal layer has a homogeneous and compact structure.
(3) electroplating: the same as step (3) in Example 1.

A copper layer having a thickness of 12 μm is electroplated and deposited, and the copper layer is compact and smooth.

EXAMPLE 7

Depositing Metal Films (Depositing Molybdenum+Deposited Nickel) Having a Thickness of 50 Nm at Each Side of the PI Films Experimental process: (1) except for the running speed of PI film of 0.5 m/minutes, other operations all are the same as those in step (1) of Example 2.

(2) directly conducting the molybdenum plasma deposition without ion implantation, subsequently the nickel plasma deposition at a deposition voltage of 0.2 KV, wherein the ion beam stream is 20 milliampere. The metal film of the resultant films has a thickness of about 50 nm, and the metal layer has a homogeneous and compact structure.

(3) electroplating: the same as step (3) in Example 1.

A copper layer having a thickness of 12 μm is electroplated and deposited, and the copper layer is compact and smooth.

Performance Test: Detection of the Bonding Force and Soldering Resistance Between the FCCLs Prepared in Examples 1-7 and the Substrate Films Test method: detecting according to the CPCA/JPCA-BM03-2005 standard "FCCLs for printed circuit" of China Printed Circuit Industry Association, and the test results are shown in Table 1.

TABLE 1

List of the performance detection results

| Test No. | Film name | Film layer composition | Film layer thickness | Electroplating copper layer thickness | Peeling strength | Test status Soldering resistance | Conclusion | Notes |
|---|---|---|---|---|---|---|---|---|
| Exp. 1 | PI | Injected copper + deposited copper | 25 nm | 12 μm | 0.56 | Good | Qualified | Double-sided |
| Exp. 2 | PI | Injected copper + deposited copper | 200 nm | 12 μm | 0.61 | Good | Qualified | Double-sided |
| Exp. 3 | PI | Injecting nickel + deposited nickel + deposited copper | 100 nm | 9 μm | 0.83 | Good | Qualified | Double-sided |
| Exp. 4 | PET | Injected chromium + deposited chromium + deposited copper | 50 nm | 12 μm | 0.76 | Good | Qualified | Double-sided |
| Exp. 5 | PI | Injected copper + deposited nickel + deposited copper | 50 nm | 12 μm | 0.69 | Good | Qualified | Double-sided |
| Exp. 6 | PI | Deposited nickel + deposited copper | 50 nm | 12 μm | 0.73 | Good | Qualified | Double-sided |
| Exp. 7 | PI | Deposited molybdenum + deposited nickel | 50 nm | 12 μm | 0.67 h | Good | Qualified | Double-sided |

Notes:
1. the peeling strength unit: N/mm;
2. Detecting according to the CPCA/JPCA-BM03-2005 standard "FCCLs for printed circuit" of China Printed Circuit Industry Association According to Table 1, it can be seen that FCCLs prepared according to the processes provided by the present invention has a lower thickness and conforms to the development tendency of flexible printed circuit (FPC). Moreover, the FCCLs have a better bonding force between the metal layer and the substrate film and a good soldering resistance.

The invention claimed is:

1. A process for a continuous production of flexible copper-clad laminate, comprising the sequent steps of:
    conducting a continuous ion implantation to a surface of an organic macromolecular polymer film;
    conducting a plasma deposition on the ion implanted surface of the organic macromolecular polymer film; and
    continuously electrocoppering the plasma deposited surface of the organic macromolecular polymer film,
    wherein the continuous ion implantation and the plasma deposition use an ion source, wherein the ion source is a magnetic filter vacuum arc ion source, the ion source is configured to provide metal ions;
    wherein during the ion implantation, the metal ions are injected inside the organic macromolecular polymer film to a depth of 1.0-10 nm, a running speed of the organic macromolecular polymer film of 0.3-2 m/minute, a voltage of 1-10 KV is used for accelerating the metal ions, and a dosage of the metal ions is $0.5 \times 10^{13}$-$1.0 \times 10^{17}$ atom/cm$^2$; and
    wherein during the plasma deposition, a plasma deposition voltage of 100-500 V is applied between the ion source and the organic macromolecular polymer film, and a flow rate of the metal ions is 20-80 milliampere.

2. The process according to claim 1, wherein the continuously electrocoppering is conducted in an electroplating component including an unreeling machine, a wind up machine, at least one main electroplating bath, an even number of first conductor roller groups horizontally disposed and parallel to each other, and a rectifier, wherein each of the first conductor roller groups includes a pair of rollers, wherein the main electroplating bath is disposed in a non-horizontal direction with an even number of first anode groups each including a pair of anodes parallel to each other, each pair of anodes in the first anode group being two anodes adjacently disposed, each anode in the first anode group being connected with an anode of the rectifier, wherein at least one first guide roller group is parallel to the conductor roller in the first conductor roller group, the guide roller of the first guide roller group being disposed below the lowest level of the anode of the first anode group to guide an operation of the organic macromolecular polymer film in the main electroplating bath, the conductor roller of the first conductor roller group being disposed at a position above the main electroplating bath and corresponding to the anode of the first anode group, each pair of the conductor rollers in the first conductor roller group being connected with a cathode of the rectifier, each pair of the conductor rollers in the first conductor roller group being two conductor rollers adjacently disposed and used in turn for being in contact with the organic macromolecular polymer film fed into the main electroplating bath and the organic macromolecular polymer film discharged from the main electroplating bath, wherein the electroplating component further includes at least a pre-electroplating bath and an odd number of second conductor roller groups each including a pair of rollers horizontally disposed and parallel to each other, the conductor rollers in the second conductor roller group being parallel to the conductor roller in the first conductor roller group, the pre-electroplating bath being disposed in a non-horizontal direction with an odd number of second anode groups each including a pair of anodes parallel to each other, each pair of anodes in the second anode group being two anodes adjacently disposed, each anode in the second anode group being connected with the anode of the rectifier, wherein at least one second guide roller group is parallel to the conductor roller in the second conductor roller group, the second guide roller group being disposed below the lowest level of the second anode to guide an operation of the organic macromolecular polymer film in the pre-electroplating bath, the conductor roller of the second conductor roller group being disposed at a position above the pre-electroplating bath and corresponding to the anode of the second anode group, each pair of the conductor rollers in the second conductor roller group being connected with the cathode of the rectifier, each pair of the conductor rollers in the second conductor roller group being two conductor rollers adjacently disposed and used in turn for being in contact with the organic macromolecular polymer film fed into the pre-electroplating bath and the organic macromolecular polymer film discharged from the pre-electroplating bath, wherein a fourth guide roller is disposed between the pre-electroplating bath and the main electroplating bath and disposed parallel to the conductor rollers in the first conductor roller group.

3. The process according to claim 2, wherein the number of the main electroplating baths is two, each of the main electroplating baths includes one guide roller from the first guide roller group, wherein the first anode is vertically disposed, two pairs of the first anode groups and the first conductor roller groups included therein;

wherein two second guide roller groups are included in the pre-electroplating bath, the second anodes being a pair of anodes vertically disposed, one pair of the second conductor roller groups is included therein, wherein a third guide roller is disposed at one side adjacent to the unreeling machine above the pre-electroplating bath and parallel to the conductor roller in the second conductor roller group.

4. The process according to claim 3, wherein each conductor roller of the first and second conductor roller groups are respectively connected with a transmission unit that causes each conductor roller of the first and second conductor roller groups to one of co-rotate and contra-rotate at a common running speed.

5. The process according to claim 4, wherein the vertical distance between each pair of the conductor rollers of the first conductor roller group and the main electroplating bath is adjustable, the distance between two conductor rollers adjacent to each other in the first conductor roller group is adjustable, the vertical distance between each pair of the conductor rollers of the second conductor roller group and the pre-electroplating bath is adjustable, and the distance between two conductor rollers adjacent to each other in the second conductor roller group is adjustable.

6. The process according to claim 5, wherein the continuously electrocoppering comprises pre-electroplating and main electroplating following the pre-electroplating, and wherein the process further comprises, before the pre-electroplating:

adjusting the vertical distances between the conductor rollers of the first and second conductor roller groups and surfaces of electroplating solutions in the main electroplating baths and pre-electroplating baths such that the vertical distances between the lowest level at which the outer surfaces of each pair of the conductor rollers of the first and second conductor roller groups are positioned and the surfaces of the electroplating solutions are 3-20 mm.

7. The process according to claim 6, wherein the pre-electroplating is conducted under an electroplating temperature of 20-28° C., an average cathode current density of 10-40 ampere/decimeter$^2$, and a running speed of the organic macromolecular polymer film of 10-50 m/h, wherein the main electroplating is conducted under an electroplating temperature of 20-28° C., an average cathode current density of 2-15 ampere/decimeter$^2$, and a running speed of the organic macromolecular polymer film of 10-50 m/h.

8. The process according to claim 7, wherein the pre-electroplating is conducted under an electroplating temperature of 20-25° C., an average cathode current density of 15-25 ampere/decimeter$^2$, and a running speed of the organic macromolecular polymer film of 15-30 m/h, wherein the main electroplating is conducted under an electroplating temperature of 20-25° C., an average cathode current density of 5-10 ampere/decimeter$^2$, and a running speed of the organic macromolecular polymer film of 15-30 m/h.

9. The process according to claim 7, wherein the electroplating solution comprises 60-150 g/l of copper sulphate, 60-150 g/l of sulfuric acid, 0.1-0.3 ml/l of hydrochloric acid, and 5-15 ml/l of additives.

10. The process according to claim 8, further comprising the step of:

passivation after the continuously electrocoppering, wherein the passivation is conducted at a temperature of 20-30° C. and a running speed of the organic macromolecular polymer film of 15-30 m/h, wherein the passivation includes a passivation solution comprising an aqueous solution comprising 0.2-5 g/l of benzotriazole.

11. The process according to claim 1, wherein the continuous ion implantation and the plasma deposition are conducted in a device including the ion source and a vacuum chamber,
- wherein the vacuum chamber includes a vacuum orifice and at least one opening connecting with the ion source on walls thereof, the vacuum chamber further including an unreeling robber, a tension adjusting unit, a cooling part, and a wind up roller;
- wherein the tension adjusting unit is disposed at both sides of the cooling part and between the unreeling robber and the wind up roller;
- wherein the cooling part is disposed between the unreeling robber and the wind up roller, the cooling part including at least one hollow cooling roller that is free to rotate and in which a cooling medium passes,
- wherein the cooling roller, the unreeling robber and the wind up roller are disposed parallel to each other, the cooling roller being disposed axially perpendicular to a direction along which plasma of the plasma deposition is fed into the vacuum chamber, the direction of the plasma and an axial direction of the cooling roller in the upright direction being horizontal, the cooling roller horizontally corresponding to the openings such that the plasma is fed into the vacuum chamber in the horizontal direction; or
- wherein the openings and the cooling roller correspond to each other in one of left and right directions and front and rear directions, the plasma being fed into the vacuum chamber in a vertical direction, the cooling roller correspondingly placed one of immediately below and immediately above the openings.

12. The process according to claim 11, wherein the device further includes an electric machine connected with the unreeling robber and the wind up roller and an accelerating component accelerating metal ions emitted from the ion source, the accelerating component being disposed between the ion source and the vacuum chamber.

13. The process according to claim 12, wherein the vacuum chamber includes six openings, three of which are respectively on two opposite walls of the vacuum chamber, two sides of the openings axially perpendicular to the cooling roller and having a size of 30-100 mm, the cooling roller having a diameter of 50-100 mm, the distance between the openings and the axial direction of the cooling roller being 50-150 mm, the distance between two adjacent openings on a common wall is 75-200 mm;
- wherein a part of the six openings are configured to pass a plasma beam for the ion implantation, and the other part of the six openings are configured to pass a plasma beam for the plasma deposition.

14. The process according to claim 11, wherein the vacuum chamber has a vacuum degree of $2\times10^{-3}$-$5\times10^{-5}$ Pa and the organic macromolecular polymer film has a thickness of 3-150 μm, wherein the plasma deposition is conducted under a running speed of the organic macromolecular polymer film of 0.3-2 m/minute.

15. The process according to claim 14, wherein the organic macromolecular polymer film has a thickness of 10-50 μm, the ion implantation voltage being 5-10 KV and the ion implantation dosage being $0.5\times10^{14}$-$5.0\times10^{16}$ atom/cm$^2$ for the ion implantation and the flow rate of the metal ions being 20-40 milliampere for the plasma deposition.

16. The process according to claim 15, wherein the plasma deposition voltage is 100-300 V.

17. The process according to claim 14, wherein the organic macromolecular polymer film is one of a polyimide film, a polyethylene terephthalate film, a liquid crystal polymer film, and a polyparabanic acid film.

18. The process according to claim 14, wherein the metal ions are selected from chromium ions, nickel ions, copper ions, and molybdenum ions.

19. The process according to claim 11, wherein the at least one opening comprises an opening for the ion implantation and an opening for the plasma deposition which are both connected with the magnetic filter vacuum arc ion source, wherein a voltage for accelerating the metal ions emitted from the ion source is applied between the opening for the ion implantation and the vacuum orifice and between the opening for the plasma deposition and the vacuum orifice.

20. The process according to claim 11, wherein a negative voltage was added to the metal ions before the metal ions are fed into the vacuum chamber, to increase the bonding force between an metal film layer formed by the plasma deposition and the organic macromolecular polymer film.

* * * * *